United States Patent
Suenaga

(10) Patent No.: US 8,921,882 B2
(45) Date of Patent: *Dec. 30, 2014

(54) LIGHT EMITTING DEVICE INCLUDING LIGHT REFLECTING RESIN AND TRANSLUCENT MATERIAL

(71) Applicant: Nichia Corporation, Anan (JP)

(72) Inventor: Ryoma Suenaga, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/958,238

(22) Filed: Aug. 2, 2013

(65) Prior Publication Data

US 2013/0313602 A1  Nov. 28, 2013

Related U.S. Application Data

(63) Continuation of application No. 13/667,695, filed on Nov. 2, 2012, now Pat. No. 8,525,218, which is a continuation of application No. 12/662,474, filed on Apr. 19, 2010, now Pat. No. 8,330,182.

(30) Foreign Application Priority Data

Apr. 20, 2009 (JP) ................................. 2009-101519
Mar. 31, 2010 (JP) ................................. 2010-080156

(51) Int. Cl.
H01L 33/00 (2010.01)
H01L 33/50 (2010.01)
H01L 33/58 (2010.01)
H01L 33/64 (2010.01)
H01L 33/46 (2010.01)
H01L 33/60 (2010.01)

(52) U.S. Cl.
CPC ................ *H01L 33/50* (2013.01); *H01L 33/58* (2013.01); *H01L 33/64* (2013.01); *H01L 33/46* (2013.01); *H01L 33/60* (2013.01)
USPC ........................................................... 257/98

(58) Field of Classification Search
CPC ..... H01L 33/50; H01L 33/505; H01L 33/507; H01L 33/508
USPC .............................................................. 257/99
See application file for complete search history.

(56) References Cited

U.S. PATENT DOCUMENTS

2004/0070338 A1* 4/2004 Noguchi et al. ............... 313/512
2010/0320479 A1* 12/2010 Minato et al. .................. 257/88

FOREIGN PATENT DOCUMENTS

JP  2005-268323     9/2005
JP  2007-019096 A   1/2007

(Continued)

OTHER PUBLICATIONS

Final Office Action U.S. Appl. No. 12/662,474 dated Mar. 12, 2012.

(Continued)

*Primary Examiner* — Benjamin Sandvik
*Assistant Examiner* — Farid Khan
(74) *Attorney, Agent, or Firm* — Foley & Lardner LLP

(57) ABSTRACT

The light emitting device has a light emitting element 101, and translucent material 102 that passes incident light from the light emitting element 101 and emits that light to the outside. The sides of the translucent material 102 perimeter are inclined surfaces 107 that become wider from the upper surface to the lower surface. The area of the lower surface of the translucent material 102 is formed larger than the area of the upper surface of the light emitting element 101. The lower surface of the translucent material 102 and the upper surface of the light emitting element 101 are joined together, and the part of the lower surface of the translucent material 102 that is not joined with the light emitting element 101 and the inclined surfaces 101 are covered by light reflecting resin 103.

23 Claims, 9 Drawing Sheets

(56) References Cited

FOREIGN PATENT DOCUMENTS

| | | | |
|---|---|---|---|
| JP | 2007-123576 | 5/2007 | |
| JP | 2008-147289 | 6/2008 | |
| WO | WO 2009/069671 | * 6/2009 | ............ H01L 33/00 |
| WO | WO-2009/069671 A1 | 6/2009 | |

OTHER PUBLICATIONS

Notice of Allowance U.S. Appl. No. 12/662,474 dated Aug. 8, 2012.

Non-Final Office Action U.S. Appl. No. 12/662,474 dated Jan. 5, 2012.

Notice of Allowance U.S. Appl. No. 13/667,695 dated May 1, 2013.

* cited by examiner (a)

(b)

(c)

LIGHT EMITTING DEVICE INCLUDING LIGHT REFLECTING RESIN AND TRANSLUCENT MATERIAL

BACKGROUND OF THE INVENTION

1. Field of the Invention

The present invention relates to a light emitting device provided with optically permeable material that allows light transmission from a light emitting element.

2. Description of the Related Art

Semiconductor light emitting devices are small size, highly power efficient devices that can emit bright colors. Further, semiconductor light emitting devices, which are semiconductor devices, do not burn-out as light-bulbs do. In addition, semiconductor light emitting devices have excellent initial operating characteristics and are robust with respect to vibration and ON-OFF switching repetitions. A semiconductor light emitting device light source can be combined with wavelength converting material excited by the light source to emit different colored light. Accordingly, light emitting devices have been developed that can emit light of various colors consistent with the principles of color mixing. To take advantage of these superior characteristics, semiconductor light emitting devices such as light emitting diodes (LEDs) and laser diodes (LDs) are used as various types of light sources. In particular, light emitting devices have recently drawn attention as long-life, low power-consumption next-generation lighting that can replace fluorescent lighting. Consequently, further increase in light output and improvement in light emission efficiency is in demand. In addition, there is demand for directional light sources with superior brightness for projection lighting such as in automobile headlights.

For example, Japanese Laid-Open Patent Publication 2007-19096 proposes a light emitting device 900, and FIG. 10 shows a cross-section view of this light emitting device 900. The light emitting device 900 is made up of an LED element 901, and a case 904 that holds the LED element 901. The case 904 is open on the side where light is extracted and the LED element 901 is mounted inside the open-side. Further, the inside of the case 904 is filled with a coating material 903 that includes light reflecting particles, and the open-side surfaces of the case 904 excluding the light extracting surface of the LED element 901 are covered with this coating material.

In addition, a fluorescent material layer 902 is disposed in sheet-form on the outer surface of the coating material 903 over the light extracting surface. The fluorescent material layer 902 is formed from resin that includes fluorescent material such as Yttrium Aluminum Garnet (YAG). The fluorescent material is excited by light emitted from the LED element 901 (blue light) and re-emits light that is converted in wavelength (yellow light).

The fluorescent material layer 902 is formed to cover the entire light extracting surface of the LED element 901, and has a light emitting surface exposed on the light extracting side. As a result, primary light (blue light) from the LED element 901 is mixed with a part of the primary light that is converted in wavelength to secondary light (yellow light) to obtain white light from the light emitting surface.

However, in the type of light emitting device described above, individual structural elements can thermally deform as a result of temperature rise during operation and the thermal history during fabrication. Thermal deformation can cause the fluorescent material layer 902 to be pushed up by the coating material 903 below. Consequently, this type of light emitting device has the problem that the fluorescent material layer 902 can delaminate or fall off. Further, since a significant amount of heat is not radiated from the fluorescent material layer 902 light extracting surface, it is necessary to increase the contact surface area of the coating material 903 and fluorescent material layer 902, which form a heat conducting path. However, if the size of the fluorescent material layer 902 is increased, brightness degradation can become a problem.

Thus, it is an object of the present invention to provide a light emitting device that can emit bright light and has superior reliability.

SUMMARY OF THE INVENTION

To achieve the object described above, the light emitting device of the present invention is provided with a light emitting element having an upper surface that forms a light extracting surface, translucent material with upper and lower surfaces where light emitted from the light emitting element is incident on the lower surface and emitted to the outside through the upper surface, and light reflecting resin that covers at least one part of the translucent material. The perimeter of the translucent material has sides that are inclined surfaces extending from, and becoming wider from the upper surface to the lower surface, and the area of the lower surface of the translucent material is formed larger than the area of the upper surface of the light emitting element. The lower surface of the translucent material and the upper surface of the light emitting element are joined together, and the part of the lower surface of the translucent material that is not joined with the light emitting element and the inclined surfaces of the translucent material are covered by the light reflecting resin. With this structure, a light emitting device can be realized in which bright light emission is possible and superior reliability is achieved.

All sides of the perimeter of the translucent material can be formed as inclined surfaces.

Further, the sides of the perimeter of the translucent material can be formed with vertical surfaces from the upper surface of the translucent material to the midpoint of the sides, and formed with inclined surfaces as described previously from the midpoint of the sides to the lower surface.

The upper surface and the lower surface of the translucent material can be formed as planar surfaces that are approximately parallel.

In addition, the upper surface of the translucent material can be formed in approximately the same plane as the top of the light reflecting resin.

Further, the inclined surfaces can be formed as planar surfaces.

The translucent material can be configured with a lower surface having a bonded surface that is joined with the upper surface of the light emitting element, and an exposed surface that protrudes out from the bonded surface. The angle between the translucent material exposed surface and an inclined surface $\theta_2$ can be an acute angle, and the angle between the translucent material upper surface and an inclined surface $\theta_1$ can be an obtuse angle.

Further, the area of the exposed surface is preferably made from 10% to 100% of the area of the bonded surface.

The light emitting device can be provided with a substrate that carries the light emitting element and the light reflecting resin.

Fluorescent material can also be included in the translucent material.

The sides of the light emitting element can be covered by the light reflecting resin.

In addition, a pair of electrodes can be established on the lower surfaces of the light emitting element, which are opposite the upper (light emitting) surface.

The inclined surfaces can be made on 50% or more of the perimeter sides of the translucent material.

Another embodiment of the light emitting device can be provided with a light emitting element having an upper surface that forms a light extracting surface, translucent material with upper and lower surfaces where light emitted from the light emitting element is incident on the lower surface and emitted to the outside through the upper surface, and light reflecting resin that covers at least one part of the translucent material. Here, the perimeter of the translucent material can have sides formed as inclined surfaces extending from the upper surface to the midpoint of the sides, and formed as vertical surfaces from the midpoint of the sides to the lower surface. The lower surface of the translucent material and the upper surface of the light emitting element are joined together, and the part of the lower surface of the translucent material that is not joined with the light emitting element and the inclined surfaces of the translucent material can be covered by the light reflecting resin.

Still another embodiment of the light emitting device can be provided with a light emitting element having an upper surface that forms a light extracting surface, translucent material with upper and lower surfaces where light emitted from the light emitting element is incident on the lower surface and emitted to the outside through the upper surface, and light reflecting resin that covers at least one part of the translucent material. The perimeter of the translucent material can have sides formed as inclined surfaces extending from the upper surface to the midpoint of the sides, and formed as reverse inclined surfaces, which incline in a direction opposite the previously described inclined surfaces, from the midpoint of the sides to the lower surface. The lower surface of the translucent material and the upper surface of the light emitting element are joined together, and the part of the lower surface of the translucent material that is not joined with the light emitting element and the inclined surfaces of the translucent material can be covered by the light reflecting resin.

The angle formed between an inclined surface and a reverse inclined surface can be an acute angle. The above and further objects of the present invention as well as the features thereof will become more apparent from the following detailed description to be made in conjunction with the accompanying drawings.

DETAILED DESCRIPTION OF THE EMBODIMENT(S)

The following describes embodiments of the present invention based on the figures.

First Embodiment

Figure 1A:
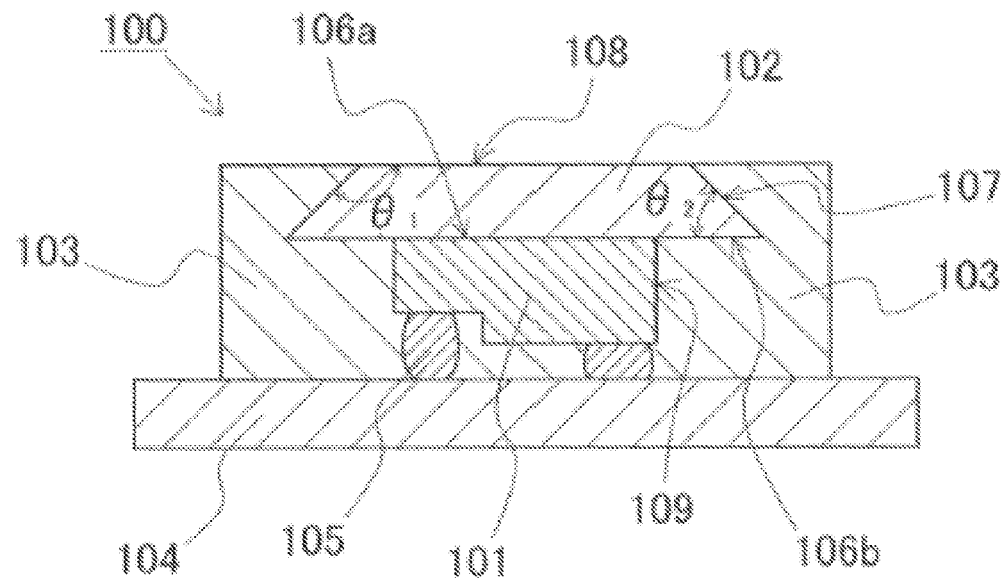
FIG. 1A is a diagrammatic cross-section view showing a light emitting device for the first embodiment of the present invention.
Figure 1B:
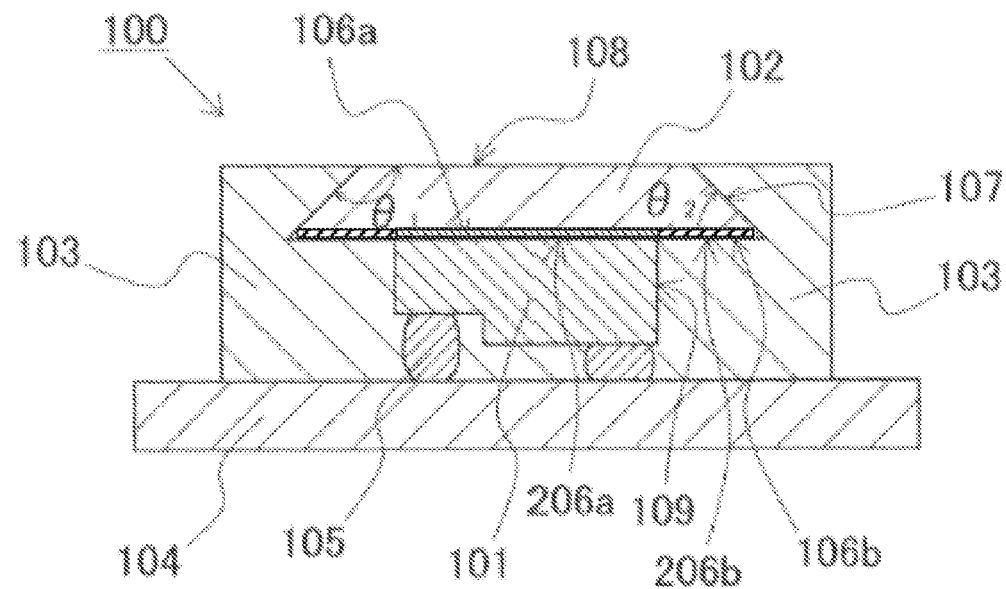
FIG. 1B is a diagrammatic cross-section view showing a light emitting device for the first embodiment, which also includes a bonding material and a metallization layer.

FIG. 1 shows a diagrammatic cross-section view of a light emitting device 100 for the first embodiment of the present invention. The light emitting device 100 shown in FIG. 1 has a light emitting element 101, and translucent material 102 that transmits light emitted from the light emitting element 101 to the outside. The sides of the perimeter of the translucent material 102 have inclined surfaces 107 that widen the translucent material 102 from the upper surface to the lower surface, and the lower surface of the translucent material 102 is formed with an area greater than the area of the upper surface of the light emitting element 101. The lower surface of the translucent material 102 and the upper surface of the light emitting element 101 are joined together, and the part of the lower surface of the translucent material 102 that is not joined with the light emitting element 101 and the inclined surfaces 107 of the translucent material 102 are covered by light reflecting resin 103. The structure and individual components of the light emitting device 100 of the present invention are described in the following.

(Light Emitting Element 101)

The light emitting element 101 used in the present invention is not limited to a particular element and well known elements can be used. However, in the present invention, use of a light emitting diode as the light emitting element 101 is preferable.

The wavelength of the light emitting element can be freely selected. For example, for a blue and green light emitting element, ZnSe or nitride based semiconductor systems ($In_XAl_YGa_{1-X-Y}N$, $0 \leq X$, $0 \leq Y$, $X+Y \leq 1$) and GaP can be used. For a red light emitting element, systems such as GaAlAs, AlInGaP can be used. In addition, semiconductor light emitting elements made from other materials can also be used. The composition, size, emission color, and number of light emitting elements employed can be selected appropriate to the application.

In the case where fluorescent material is used, a semiconductor nitride ($In_XAl_YGa_{1-X-Y}N$, $0 \leq X$, $0 \leq Y$, $X+Y \leq 1$) that can emit short wavelength light is desirable to enable efficient excitation of the fluorescent material. Various emission wavelengths can be selected depending on the semiconductor layer materials and the crystal mix.

The light emitting element 101 for the first embodiment has a positive and negative pair of electrodes disposed on the same side. The electrodes are connected to conducting runs (not illustrated) on the substrate 104 through conducting material 105 by flip-chip surface mounting. The surface on the opposite side from the electrodes is the light extracting surface of the light emitting element 101. The light emitting element 101 is fabricated by forming nitride based semiconductor layers on a transparent sapphire substrate designed for semiconductor growth, and that sapphire substrate is flipped to the top of the light emitting element 101 to become the light extracting surface. The sapphire substrate has steps with hills and valleys at the interface with the nitride based semiconductor layers. When light from the nitride based semiconductor layers is incident on the stepped interface, the critical angle of the incident light is intentionally changed to allow the light to be easily extracted outside the sapphire substrate. Here, the substrate layer for semiconductor growth can also be removed. For example, the substrate layer can be removed by techniques such as polishing or laser lift off (LLO). Further, the substrate layer for semiconductor growth is not limited to sapphire, and sapphire can be replaced by suitable alternatives.

(Translucent Material 102)

The translucent material 102 of the present invention is material that allows light emitted from the light emitting element 101 to be transmitted to the outside. The translucent material 102 can include fluorescent material that allows at least part of the incident light to be converted in wavelength. For example, material from a fluorescent material ingot such as single crystal fluorescent material, polycrystalline fluorescent material, and sintered fluorescent material powder can be used. Further, fluorescent material powder, which is mixed with materials such as resin, glass, or inorganic material and sintered, can also be used. A high degree of transparency allows light to be more easily reflected from the interface with light reflecting resin 103, which is described later, and is preferable to improve brightness. The thickness of the translucent material 102 is not specifically restricted, and although it can be changed as necessary, it can be approximately 50 µm to 300 µm for example.

Materials such as Yttrium Aluminum Garnet (YAG) and Barium ortho-Silicate (BOS) are representative of fluorescent materials that can be used advantageously as wavelength converting material to emit white light when combined with a blue light emitting element. For a light emitting device capable of emitting white light, the concentration of the fluorescent material in the translucent material 102 is adjusted to produce white light. Although the fluorescent material concentration can be adjusted as required, it can be approximately 5% to 50% for example. Although thin translucent material 102 is desirable for good light extraction efficiency, the thinner the layer, the greater the reduction in strength. Consequently, it is preferable to adjust the previously mentioned fluorescent material concentration and translucent material 102 thickness within a suitable range.

Further, by inclusion of red light producing fluorescent material in the adhesive bond used to join the blue light emitting element 101 and the translucent material 102 including wavelength converting material, a light emitting device can be made that emits light-bulb-color in accordance with Japanese Industrial Standards (JIS). Specifically, by color mixing the blue light emitted from the light emitting element 101 with yellow and red light from the fluorescent material, a warm white light can be emitted. Good light extraction efficiency results from distributing fluorescent material that converts light to the longer wavelengths closest to the light emitting element 101 source and fluorescent material that converts light to shorter wavelengths further away. Consequently, effective light extraction can be achieved by including red light producing fluorescent material in the adhesive bond closest to the light emitting element 101. Here, it is preferable to distribute fluorescent material with superior heat resistant properties in the immediate vicinity of the light emitting element 101.

The translucent material 102 has a lower surface (a bonded surface 106a and exposed surface 106b in FIG. 1) on which light from the light emitting element 101 is incident, and an upper surface 108 from which light from the light emitting device is emitted. The upper and lower surfaces of the translucent material can be approximately parallel planar surfaces, planar surfaces having steps with hills and valleys (grating), or curved surfaces. For example, the surface on the light emitting side can have a lens-shaped configuration. The upper surface of the translucent material 102 can have a lens-shape to focus light emitting element 101 light, or it can have steps with hills and valleys to diffuse light from the light emitting element 101. The lower surface of the translucent material 102, on which light is incident, can also have steps with hills and valleys.

By establishing steps with hills and valleys on the lower surface of the translucent material 102, incident light from the light emitting element 101 can be scattered to reduce color and brightness non-uniformities. In particular, when a single translucent material 102 layer is joined to a plurality of light emitting elements 101, the effects of color and brightness non-uniformities can be large due to light emitting element 101 placement and resulting light distribution. Here, light scattering by the lower surface of the translucent material 102 is advantageous to reduce those non-uniformities.

(Light Emitting Element 101 and Translucent Material 102 Interface)

As shown in FIG. 1, the light extracting upper surface of the light emitting element 101 and the lower surface of the translucent material 102 can be joined together at the bonded surface 106a. For example, the surfaces can be joined by compression bonding, sintering, bonding with well-known adhesive bonds such as epoxy or silicone, bonding with a high index of refraction organic adhesive bond, or bonding with a low melting point glass. Here, the interface of the joined surfaces (bonded surface) is defined not only in the limited sense of direct connection of the two surfaces, but also includes connection via adhesive bond or other intervening material. The area of the lower surface of the translucent material 102 is formed larger than the area of the upper surface of the light emitting element 101. With this arrangement, the translucent material 102 receives light through a surface area larger than the light emitting surface of the light emitting element 101 and light loss can be reduced. Further, the upper surface of the light emitting element 101 can be covered by the lower surface of the translucent material 102 even when some misalignment occurs during positioning of the translucent material 102 on top of the light emitting element 101. This can essentially eliminate brightness variation due to surface mounting and improve yield. Here, bonded surface area is the area of the upper surface of the light emitting element 101 that is joined to the lower surface of the translucent material 102 when those surfaces are planar. When those surfaces are not planar, the bonded surface area is the area of the upper surface of the light emitting element 101 that is coincident with the lower surface of the translucent material 102 viewed from the upper surface of the translucent material 102. Specifically, this is the area of the upper surface of the light emitting element 101 projected to a planar surface on top of the translucent material 102. As a result of this structure, the translucent material 102 has a lower surface region that is not joined with the light emitting element 101. Explained differently, the translucent material 102 has a lower surface region (exposed surface 106b) that is outside the bonded surface 106a where the lower surface of the translucent material 102 joins the upper surface of the light emitting element 101. The area of the exposed surface 106b is preferably 10% to 100% the area of the bonded surface 106a.

In the case where the inclined surfaces 107 and exposed surface 106b intersect, the translucent material 102 exposed surface 106b extends out from the bonded surface 106a to form an acute angle $\theta_2$ with the inclined surfaces 107 as shown in FIG. 1. Consequently, when bonding material 206a is used at the interface of the light emitting element 101 and translucent material 102, bonding material creep up the inclined surfaces 107 can be suppressed by the presence of the exposed surface 106b. Bonding material can absorb or scatter light from the light emitting element 101, while the light reflecting resin 103 can efficiently reflect light from the light emitting element 101. Therefore, it is preferable to avoid intervening bonding material on surfaces other than the bonded surface 106a. However, bonding material 206a extending out from the bonded surface 106a to the exposed surface 106b and even to the inclined surface 107 is not a significant obstruction. Further, the exposed surface 106b can be covered by a light reflecting material such as a metallization layer 206b. In that case, light can be effectively reflected from the exposed surface 106b even when bonding material 206a extends to the exposed surface 106b.

(Inclined Surfaces 107)

As shown in FIG. 1, the sides of the perimeter of the translucent material 102 of the present invention are inclined surfaces 107 that widen from the upper surface to the lower surface. As a result of covering these inclined surfaces 107 and the exposed surface 106b with light reflecting resin 103, the translucent material 102 can be fixed in place by the light reflecting resin 103. Consequently, there is no fear of the translucent material 102 delaminating or falling off.

Further, by increasing the area of the interface between the translucent material 102 and the light reflecting resin 103, heat transfer from the translucent material 102 can be increased.

For the case where the translucent material 102 includes fluorescent material, if delamination occurs between the translucent material 102 and the light emitting element 101, the fluorescent material distribution with respect to distance from the light emitting element 101 changes producing undesirable shift in the color of the emitted light. In the present invention, the translucent material 102 is held in a fixed position by the light reflecting resin 103, and since delamination does not occur, color shift is not a concern.

By establishing inclined surfaces 107 in the previously described manner and by making the externally exposed upper surface 108 region of the translucent material 102 smaller, the region of the translucent material 102 buried in, and held in place by the light reflecting resin 103 can be made larger. This can improve translucent material 102 heat transfer without inducing any loss of brightness, and can reduce the thermal resistance of the light emitting device. In particular, when fluorescent material is included in the translucent material 102 to convert the wavelength of the light emitted from the light emitting device, fluorescent material self-heating can occur, which is the cause of Stokes loss (shift). Since the light conversion efficiency of a fluorescent material is degraded by this self heating, efficient transfer of heat from the fluorescent material is required. Consequently, the contact surface area of the translucent material 102 with the light reflecting resin 103, which is the path for heat flow from the translucent material 102, can be increased to improve heat transfer from the translucent material 102 and the included fluorescent material. By establishing inclined surfaces 107, the surface area of the sides of the translucent material 102 can be increased compared to the surface area for vertical sides between the upper surface 108 and lower surface of the translucent material 102. This increases the contact surface area of the translucent material 102 and light reflecting resin 103.

The inclined surfaces 107 do not necessarily have to be continuous between the upper surface 108 and the lower surface of the translucent material 102. The perimeter sides can have at least one part with an inclined surface 107 that widens from the upper surface towards the lower surface. Accordingly, the sides of the translucent material 102 can also have surfaces that are different from the inclined surfaces 107. It is preferable to make the surface area of the inclined surfaces 107 greater than the surface area of the previously described exposed surface 106b to more effectively hold the translucent material 102.

Figure 6:
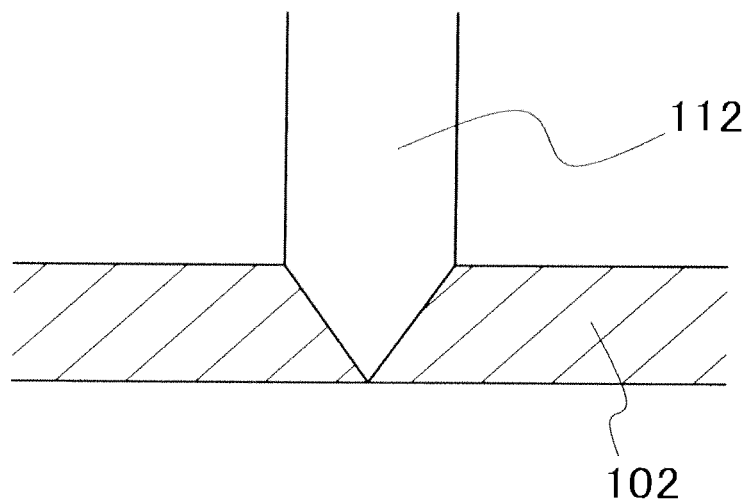
FIG. 6 is a diagram showing a fabrication method for translucent material for the first embodiment of the present invention.
Figure 6:
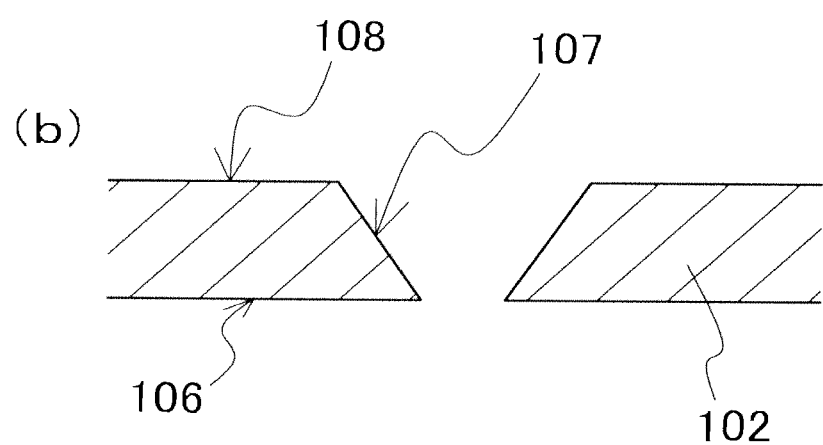

Inclined surfaces 107 can be formed relatively simply during dicing and singulation of the translucent material 102. Inclined surfaces 107 can be formed by suitable adjustment of the angle and width of the dicing blade, and by employing techniques such as half-cut dicing. For example, as shown in FIG. 6 (*a*), the translucent material 102 can be bevel-cut using a bevel-cut blade 112. As shown in FIG. 6 (*b*), inclined surfaces 107 can be formed on the sides of translucent material 102 cut in this manner. Since the inclined surfaces 107 are covered by light reflecting resin 103 and light is more easily reflected by smooth surfaces with no steps or hills and valleys, smooth surfaces are preferable to increase brightness.

The translucent material 102 for the first embodiment is made in a flat plate or sheet form with an upper surface 108 and a lower surface, which is joined to the light emitting element 101, that are essentially parallel and planar. The side surfaces of the translucent material 102 have inclined surfaces 107 that widen the translucent material 102 from the upper surface to the lower surface. Described differently with reference to FIG. 1, the inclined surfaces 107 are formed to make obtuse angles $\theta_1$ with respect to the planar upper surface 108. The inclined surfaces 107 and the exposed surface 106b are covered as a unit by the light reflecting resin 103. This allows the translucent material 102 to be held in a vertically fixed position by the light reflecting resin 103, and can prevent the translucent material 102 from pealing or falling off. Further, since the contact surface area between the translucent material 102 and the light reflecting resin 103 can be made large, the surface area for heat transfer from the translucent material 102 to the light reflecting resin 103 can also be large to improve heat transfer from the translucent material 102.

(Light Reflecting Resin 103)

In the present invention, as shown in FIG. 1, the light reflecting resin 103 covers the translucent material 102 inclined surfaces 107 and exposed surface 106b. By exposing at least the light extraction surface of the light emitting element 101 from the light reflecting resin 103, a configuration is formed that allows light to be incident on the translucent material 102. The light reflecting resin 103 is a material that can reflect light from the light emitting element 101. Light from the light emitting element 101 is reflected inside the translucent material 102 by the interface between the translucent material 102 and the light reflecting resin 103. Consequently, light is propagated into the interior of the translucent material 102 and ultimately is emitted to the outside from the upper surface 108 of the translucent material 102.

Here, it is preferable for the upper surface of light reflecting resin 103 to be lower than the upper surface 108 of the translucent material 102. This is because light emitted from the upper surface 108 of the translucent material 102 also shines in lateral directions. If the upper surface of the light reflecting resin 103 is higher than the upper surface of the translucent material 102, light emitted from the upper surface of the translucent material 102 will be incident on the light reflecting resin 103 and will be reflected to cause non-uniform light dispersion. Therefore, it is preferable to reduce the height of the light reflecting resin 103 covering the sides of the perimeter of the translucent material 102 and allow direct extraction of light emitted to the outside.

It is also preferable for the light reflecting resin 103 to cover the sides of the light emitting element 101 as well as the sides and exposed surface 106b of the translucent material 102. Light emitted towards the side surfaces 109 of the light emitting element 101 is reflected back into the light emitting element 101 by the light reflecting resin 103 to emit light emitting element 101 light into the lower surface of the translucent material 102.

The light reflecting resin 103 can be formed by including reflecting material in a resin such as silicone resin, modified silicone resin, epoxy resin, modified epoxy resin, acrylic resin, or a hybrid resin made up of at least one or more of these resin types. Compounds such as titanium oxide, silicon dioxide, titanium dioxide, zirconium dioxide, potassium titanate, alumina, aluminum nitride, boron nitride, and mullite can be used as reflecting material. Since the amount of light transmission and reflection depends on the concentration and density of the included reflecting material, the concentration and density can be adjusted according to size and shape of the light emitting device. For example, for a relatively small light emitting device, it is necessary to form a thin first light reflecting material layer, and a high concentration of reflecting material is preferable to suppress the leakage of light through that thin layer. Meanwhile, during the manufacturing flow to form or apply the light reflecting resin, manufacturability problems can result from a high concentration of reflecting material. In that case, the concentration can be appropriately adjusted. For example, it is preferable to include reflecting material in the light reflecting resin with a concentration greater than or equal to 30% by weight with a thickness greater than or equal to 20 μm.

In addition, heat transfer can be improved by using a reflecting material with good heat transfer properties as well as reflecting properties. High thermal conductivity materials such as aluminum nitride and boron nitride are examples of reflecting material with good heat transfer properties. Further, material specifically for the purpose of heat dissipation can also be added separate from the reflecting material. For example, by adding a heat dissipating material to the resin with a concentration greater than or equal to 5% by weight, the thermal conductivity of the light reflecting resin 103 can preferably be raised to 3 W/m·K or more. Further, it is preferable to use light reflecting material that is the same as the primary material used to form the substrate 104 described below. This can produce a light emitting device that is robust with respect to thermal stress.

The method of forming the light reflecting resin 103 is also not limited to a specific method. For example, techniques such as injection molding, potting methods, resin printing methods, transfer molding, or compression molding can be used to form the light reflecting resin.

In the light emitting device of the present invention, a protection device such as a Zener diode can also be included. By embedding the protection device in the light reflecting resin 103, degraded light extraction due to protection device absorption or blockage of light from the light emitting element can be prevented.

(Substrate 104)

The light emitting element 101 is mounted on a substrate 104. Insulating materials such as glass epoxy, resin, or ceramics are examples of substrate 104 materials. Metals formed as insulating material or insulating materials formed on metals can also be used. In particular, preferable materials are those on which conducting runs (not illustrated) can be formed to make electrical connection with the light emitting element 101 mounted on the surface. Ceramics, which are robust with respect to high temperatures and harsh environments, are advantageously used as this type of material. Preferable ceramics for this type of application are materials such as alumina, aluminum nitride, and mullite. Here, even when the supporting substrate is a ceramic material, part of the substrate can also be a layer of insulating material other than a ceramic. BT (bismaleimide-triazine) resin, glass epoxy resin, and other epoxy based resins are examples of materials that can be used as this insulating material. To suitably dissipate heat from the light emitting element 101, a substrate 104 thermal conductivity greater than or equal to 150 W/m·K is desirable.

The substrate 104 can also be configured with a cavity. In that case, the light reflecting resin 103 can be easily formed by methods such as applying drops and hardening the resin. Examples of structures formed with cavities are laminated substrate structures, injection molded resin material, and molded interconnect devices (MIDs).

Although the first embodiment mounts a single light emitting element 101 on the substrate 104, the number of light emitting elements 101 that can be mounted is not limited. The number of light emitting elements can be changed as necessary according to the desired size and brightness of the light emitting device. When a plurality of light emitting elements 101 are mounted in the light emitting device, separate translucent material 102 can be attached to each light emitting element 101, or a single translucent material 102 layer can be attached to a plurality of light emitting elements 101.

Second Embodiment

Figure 2:
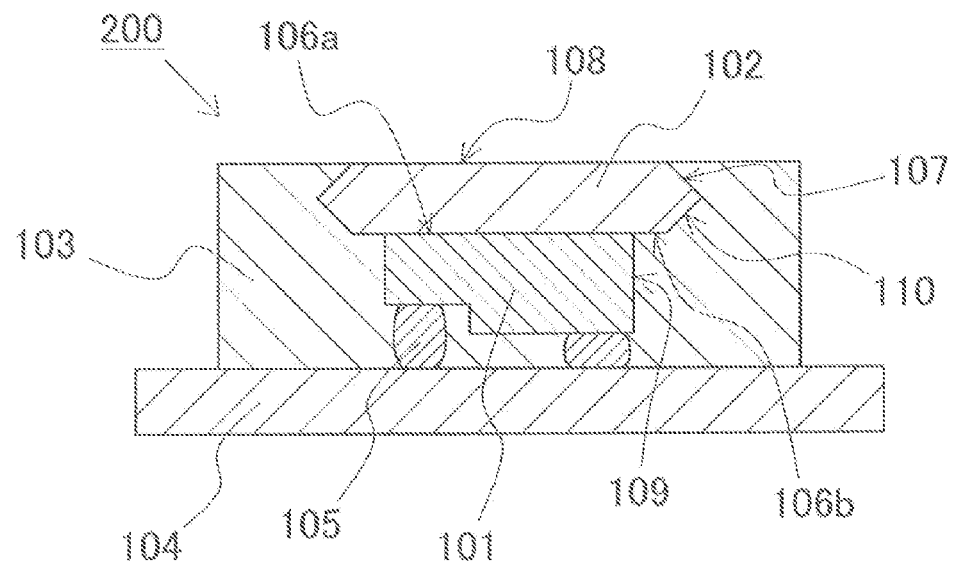
FIG. 2 is a diagrammatic cross-section view showing a light emitting device for the second embodiment of the present invention.

FIG. 2 shows the light emitting device 200 for the second embodiment. The light emitting device 200 for the second embodiment is different from the light emitting device 100 for the first embodiment in that the sides of the translucent material 102 have inclined surfaces 107 and reverse inclined surfaces 110. By establishing reverse inclined surfaces 110 that widen the translucent material 102 in the upward direction, light from the light emitting element 101 can be efficiently reflected towards the upper surface 108 to produce a light emitting device with high brightness. Further, by forming the entire sides of the perimeter of the translucent material 102 as inclined surfaces, it is possible to widen the surface area of the sides of the perimeter. This allows the surface area of the translucent material 102 interfacing with the light reflecting resin 103 to be increased, and is desirable for good heat dissipation.

Figure 7:
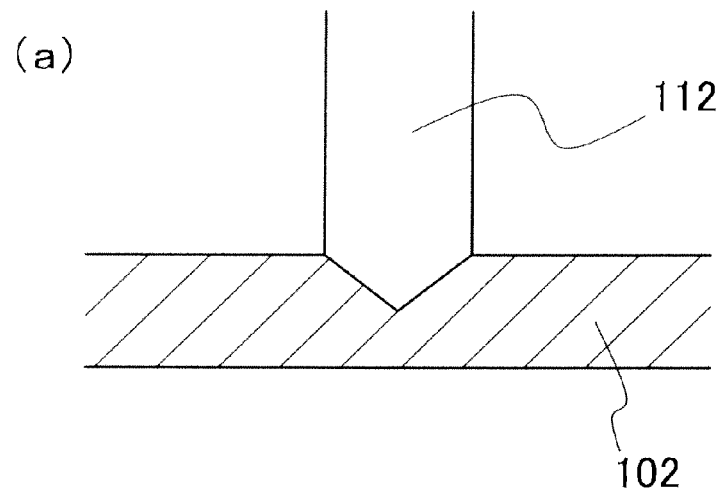
FIG. 7 is a diagram showing a fabrication method for translucent material for the second embodiment of the present invention.
Figure 7:
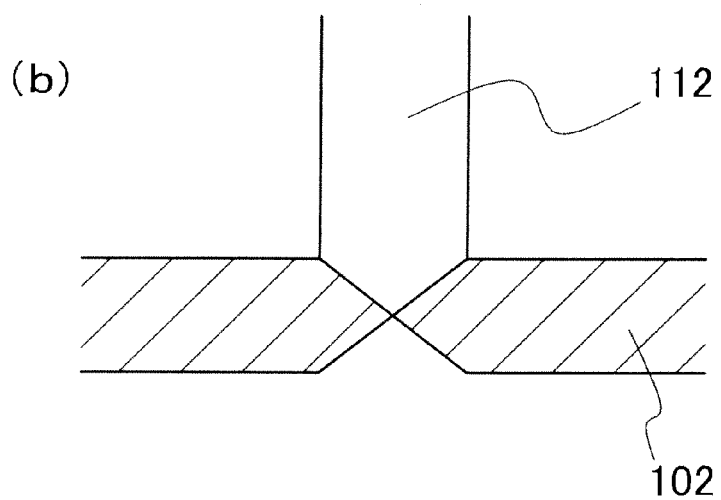
Figure 7:
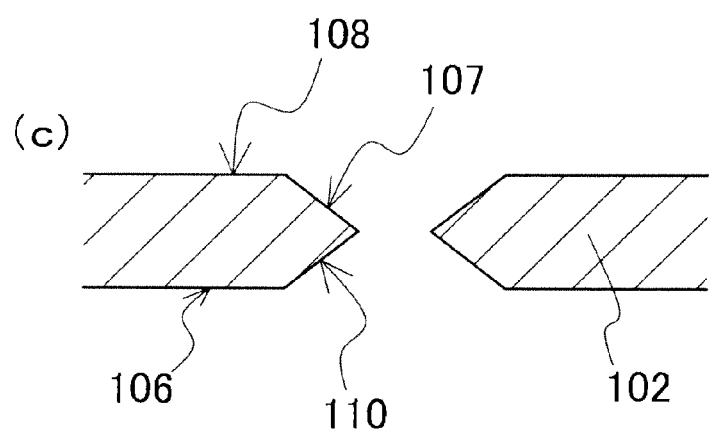

The translucent material 102 for the second embodiment can be formed as shown in FIG. 7. Specifically, the translucent material 102 can be cut approximately halfway from the upper surface 108 with a bevel-cut blade 112 by half-cut dicing (FIG. 7 (a)). The inclined surface and reverse inclined surface can be completely formed by performing the same half-cut dicing from the opposite side of the translucent material 102 (FIG. 7 (*b*)).

As shown in FIGS. 2 and 7 (*c*), the translucent material 102 has the upper surface 108 connected to inclined surfaces 107, the inclined surfaces 107 connected to symmetric reverse inclined surfaces 110, and the reverse inclined surfaces 110 connected to the lower surface 106. Described differently, the translucent material 102 is widest at approximately the midpoint of a vertical cross-section through the translucent material 102. From the upper surface 108 to the midpoint, the translucent material 102 gradually becomes wider, and from the midpoint to the lower surface 106, the translucent material 102 gradually narrows. As shown in FIG. 2, it is preferable to form an acute angle between the inclined surfaces 107 and the reverse inclined surfaces 110.

Third Embodiment

Figure 3:
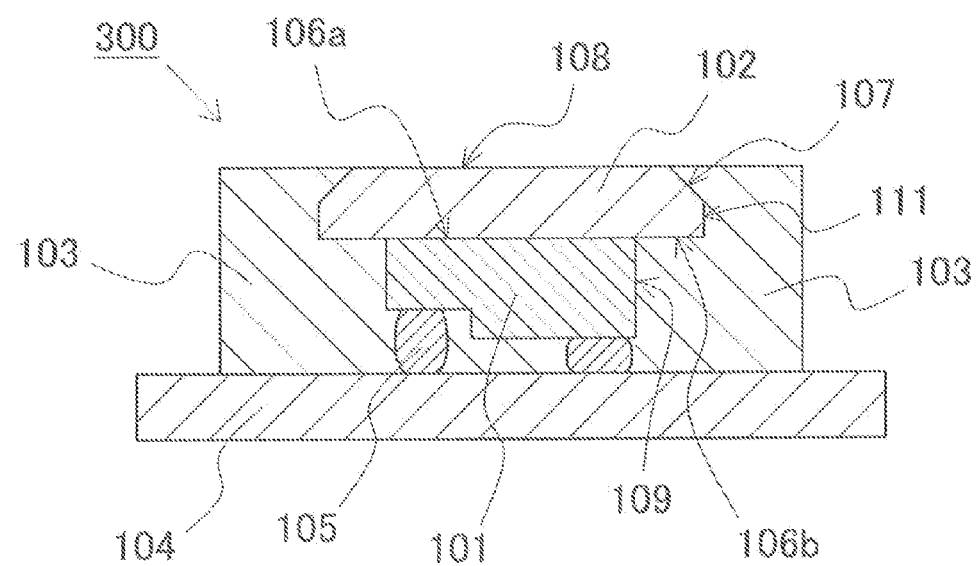
FIG. 3 is a diagrammatic cross-section view showing a light emitting device for the third embodiment of the present invention.

FIG. 3 shows the light emitting device 300 for the third embodiment. The light emitting device 300 for the third embodiment is different from the light emitting device 100 for the first embodiment in that the sides of the translucent material 102 have inclined surfaces 107 forming corner regions with the upper surface 108 and vertical surfaces 111 approximately vertical with respect to the lower surface 106. The translucent material 102 of the third embodiment has no corner regions with acute angles. Individual structural elements of the light emitting device can thermally deform as a result of temperature rise during operation and the thermal history during fabrication. If the translucent material 102 has acute angle corner regions, stress during thermal deformation can concentrate at the corner regions, and damage to the translucent material 102 can be a concern. By forming the translucent material 102 with no acute angle corner regions as in the third embodiment, the concentration of stress at certain locations can be alleviated.

Figure 8:
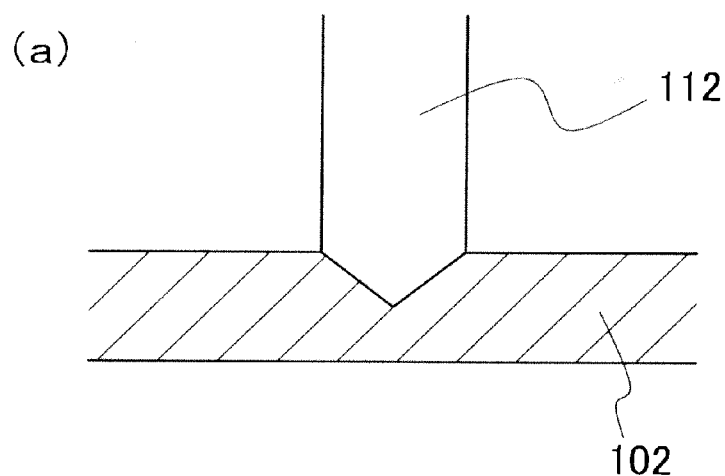
FIG. 8 is a diagram showing a fabrication method for translucent material for the third embodiment of the present invention.
Figure 8:
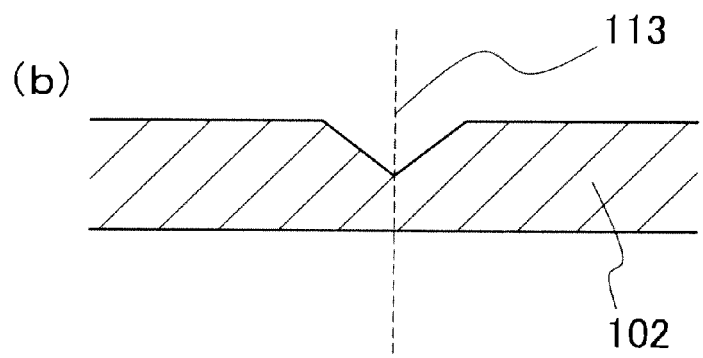
Figure 8:
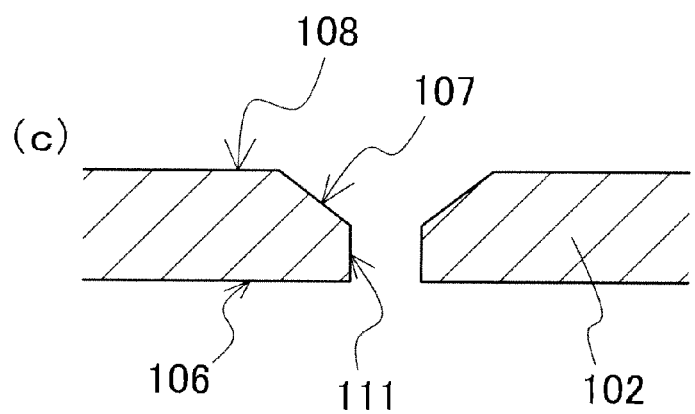

The translucent material 102 for the third embodiment can be formed as shown in FIG. 8. Specifically, the translucent material 102 can be cut approximately halfway from the upper surface 108 with a bevel-cut blade 112 by half-cut dicing to form a cross-section having a V-shaped trough (FIG. 8 (*a*)). Next, the translucent material can be completely cut along the deepest part of the V-shaped trough in a straight line, which is approximately vertical with respect to the lower surface 106 (broken line 113), with a dicing blade (FIG. 8 (*b*)). This can form translucent material 102 with inclined surfaces 107 at the upper surface 108 corner regions (FIG. 8 (*c*)).

Fourth Embodiment

Figure 4A:
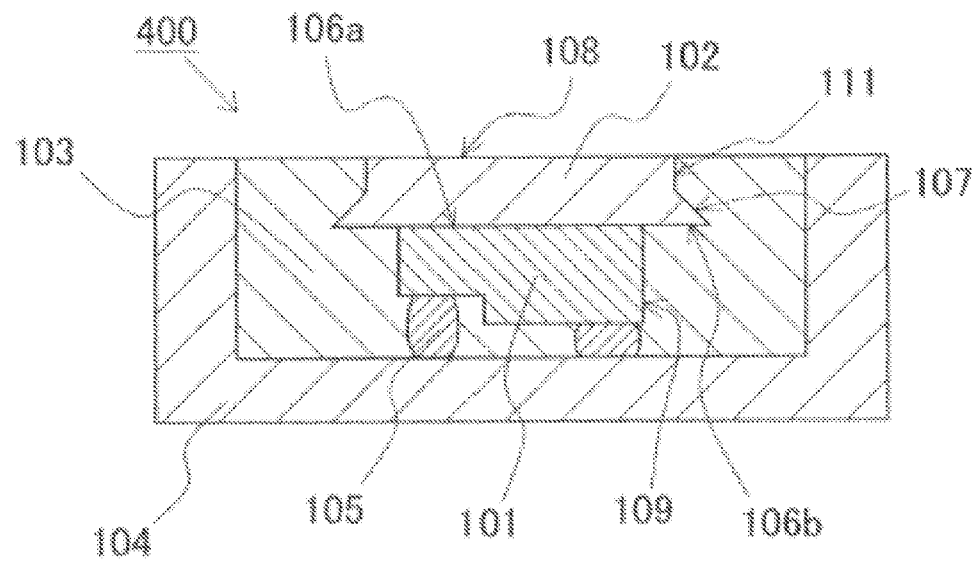
FIG. 4A is a diagrammatic cross-section view showing a light emitting device for the fourth embodiment of the present invention.
Figure 4B:
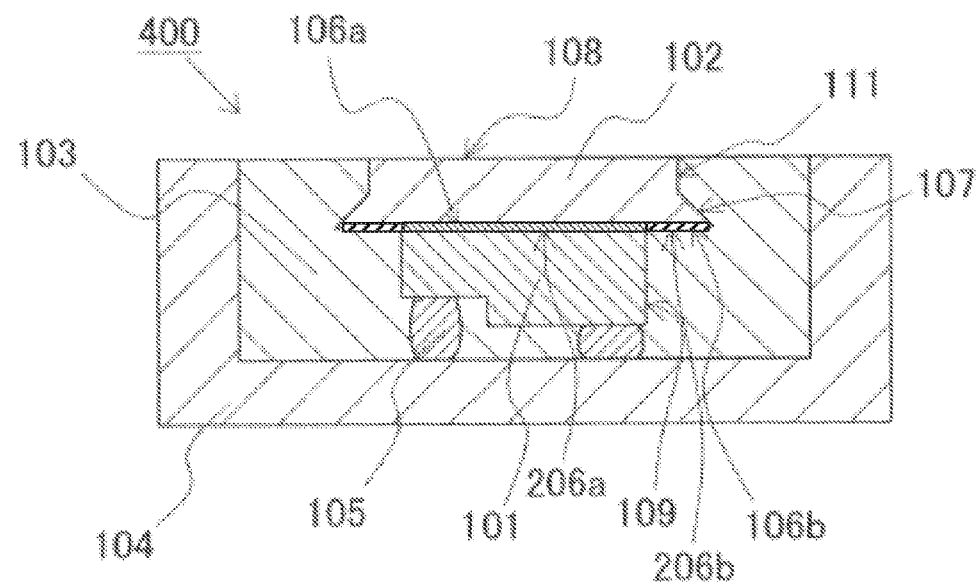
FIG. 4B is a diagrammatic cross-section view showing a light emitting device for the fourth embodiment, which also includes a bonding material and a metallization layer.

FIG. 4 shows the light emitting device 400 for the fourth embodiment. The light emitting device 400 for the fourth embodiment is different from the light emitting device 100 for the first embodiment in that the sides of the translucent material 102 have inclined surfaces 107 and vertical surfaces 111 approximately vertical with respect to the upper surface 108, and in that the substrate 104 is not flat and is configured with a cavity. By implementing this type of substrate cavity, the light reflecting resin 103 formation can be simplified.

The translucent material 102 of the fourth embodiment has corner regions with inclined surfaces 107 formed in a manner protruding outward from the lower surface 106. Consequently, the translucent material 102 is formed with a bottom region that can be held fixed by the light reflecting resin 103, and an upper region that has perimeter sides formed vertical with respect to the upper surface. As a result, the upper surface 108, which is the light emitting region, has an outline that is not covered with resin to form a clearly visible light emitting region.

Figure 9:
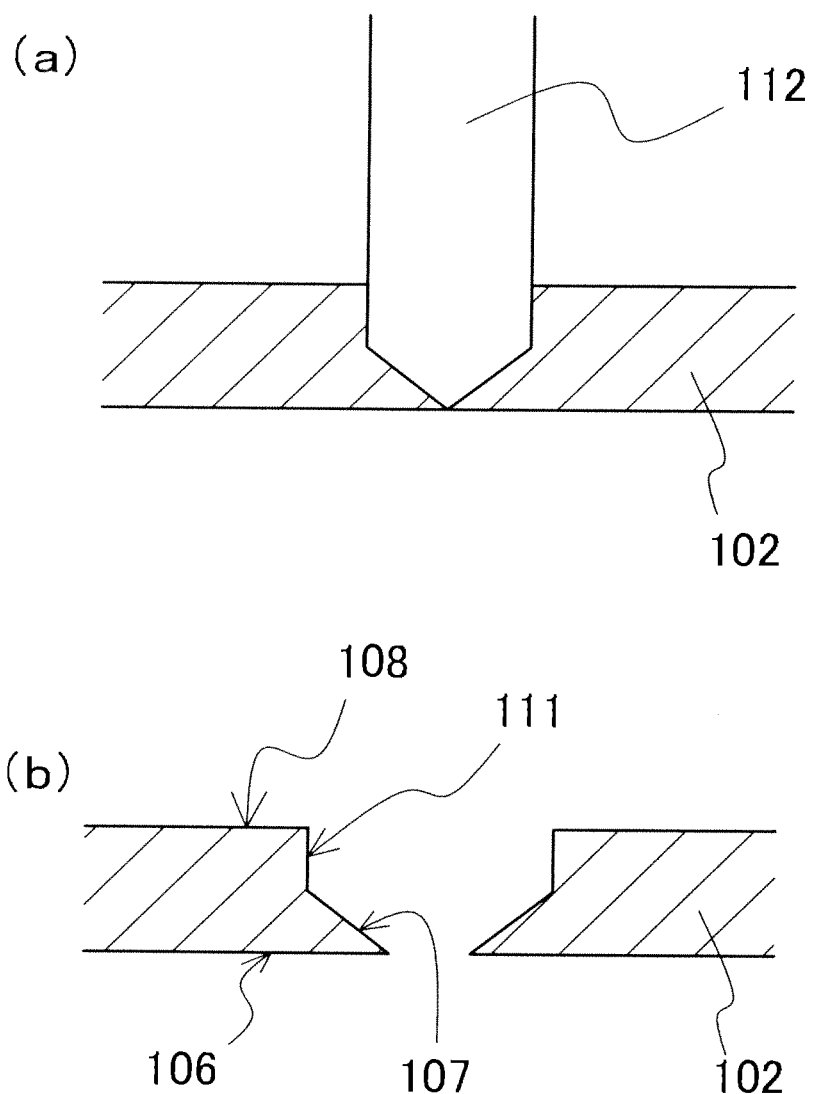
FIG. 9 is a diagram showing a fabrication method for translucent material for the fourth embodiment of the present invention.
Figure 10:
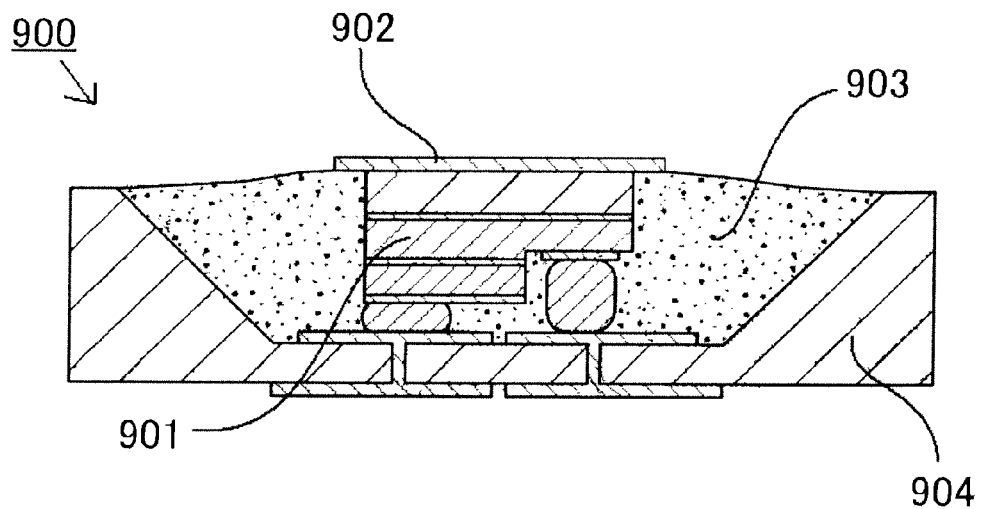
FIG. 10 is a diagrammatic cross-section view showing a prior art light emitting device.

The translucent material 102 for the fourth embodiment can be formed as shown in FIG. 9. Specifically, the translucent material 102 can be diced by a bevel-cut blade 112 with inclined surface bevel edges that extend to approximately half the thickness of the translucent material 102 (FIG. 9 (*a*)). This can produce translucent material 102 with sides that have inclined surfaces 107 and vertical surfaces 111 approximately vertical with respect to the upper surface 108 of the translucent material 102 (FIG. 9 (*b*)).

Fifth Embodiment

Figure 5:
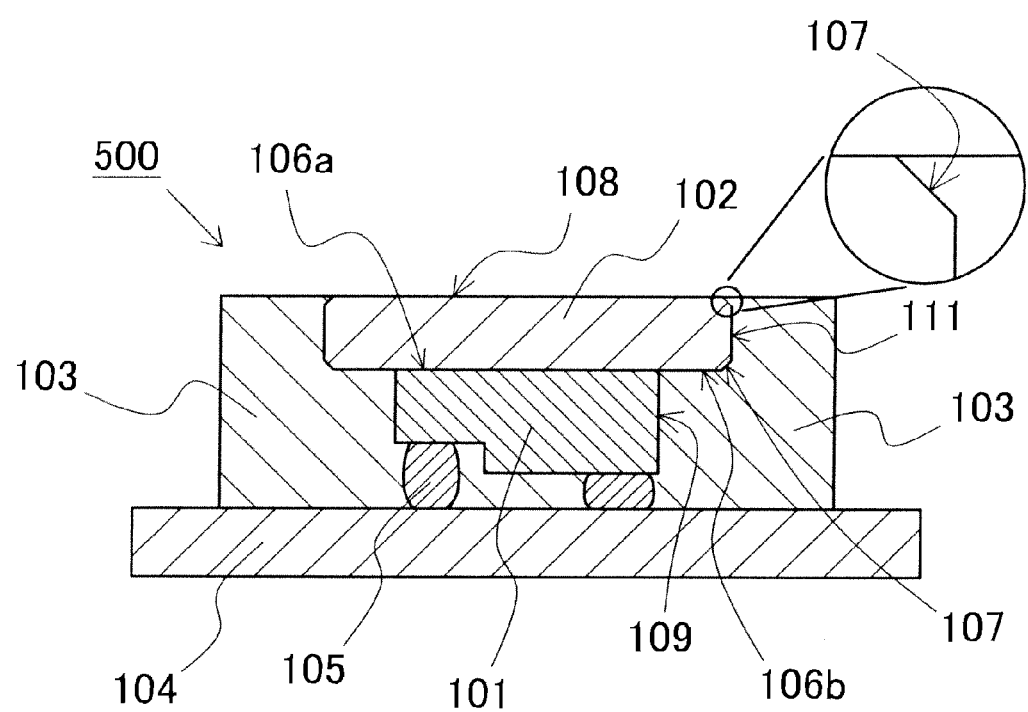
FIG. 5 is a diagrammatic cross-section view showing a light emitting device for the fifth embodiment of the present invention.

FIG. 5 shows the light emitting device 500 for the fifth embodiment. In the light emitting device for the fifth embodiment, the sides of the translucent material 102 have inclined surfaces 107 and vertical surfaces 111 approximately vertical with respect to the upper surface 108. The inclined surfaces 107 are formed by beveling (chamfering) the corner region edges of the flat-plate translucent material 102. Since this embodiment is similar to the third embodiment in that it has no acute angle corner regions, stress on the translucent material 102 can be moderated. In addition, since the corner regions are beveled-off, void generation in the light reflecting resin 103 can be suppressed. Voids can easily be generated at corner regions during light reflecting resin 103 formation. Accordingly, voids can easily be generated at interface regions between the light reflecting resin 103 and the translucent material 102. When a void is created at the interface between the light reflecting resin 103 and the translucent material 102, light that should be reflected by the light reflecting resin 103 is not reflected as a result of the void, and light extraction efficiency is degraded. By removing translucent material 102 corner edges in the present embodiment, void generation can be suppressed.

The following describes in detail a method of manufacture for an embodiment of the present invention. However, the present invention is in no way limited to the following embodiment.

First Embodiment Fabrication

First embodiment fabrication describes manufacture of the light emitting device shown in FIG. 1.

(First Fabrication Step)

First, the light emitting element 101 is mounted on the substrate 104. Aluminum nitride is used as the substrate 104 for this embodiment. The surface of the aluminum nitride sheet, which has a thermal conductivity of 170 W/m·K, is patterned by printing tungsten conducting runs for electrical connection of the light emitting element 101. Subsequently, the conducting runs are heat treated and plated with nickel, palladium, and gold in that order. Gold bumps (conducting material) 105 are used to mount 1 mm×1 mm light emitting elements 101 on an aluminum nitride assembly of many individual substrates 104. Each light emitting element 101 is formed as semiconductor layers on a sapphire substrate, which is flip-chip mounted putting the sapphire substrate at the light emitting surface. Here, FIG. 1 shows a single light emitting device, but the following second and third fabrication steps are performed on the assembly of many die and individual light emitting device die are singulated at the back end of the process.

(Second Fabrication Step)

Next, translucent material 102 with inclined surface 107 perimeter sides is attached to the upper surface of the light emitting element 101. The sides of the perimeter of the translucent material 102 have inclined surfaces 107 that widen the translucent material 102 from the upper surface 108 towards the lower surface. The upper and lower surfaces of the translucent material 102 are formed as approximately planar surfaces, and the angle $\theta_2$ between the lower surface 106 of the translucent material 102 and the inclined surfaces 107 is a 45° angle. In the present embodiment, silicone resin is used a bonding adhesive, and the translucent material 102 is bonded to the light emitting element 101 sapphire substrate bonded surface 106a by hardening the silicone. The translucent material 102 of the present embodiment is a mixture of YAG and alumina that is sintered to form fluorescent material sheet. By forming the translucent material 102 from inorganic materials, degradation is reduced and a high reliability light emitting device can be produced. The area of the lower surface of the translucent material 102 is formed larger than the area of the upper surface of the light emitting element 101, and the translucent material 102 is attached with an exposed surface 106b that extends out from the bonded surface 106a with the light emitting element 101.

(Third Fabrication Step)

Next, the translucent material 102 exposed surface 106b and inclined surfaces 107 are covered as a unit with light reflecting resin 103 by transfer molding. In the present embodiment, the light reflecting resin 103 is silicone resin with 30% by weight titanium oxide included. The thermal conductivity of the titanium oxide included light reflecting resin 103 of the present embodiment is on the order of 1 W/m·K. Heat from the translucent material 102 can be effectively dissipated through the light reflecting resin 103. The side surfaces 109 of the light emitting element 101 are also covered by light reflecting resin 103 together with the translucent material 102 exposed surface 106b and inclined surfaces 107.

(Fourth Fabrication Step)

Finally, the assembly that includes many die fabricated by the first through third steps is diced to cut and singulate each die and produce the light emitting device 100 for the first embodiment.

For a light emitting device 100 fabricated in this manner, the translucent material 102 is held in place by the light reflecting resin 103 preventing the translucent material 102 from falling off. Further, since heat from the translucent material 102 can be effectively dissipated through the light reflecting resin 103, the thermal resistance of the light emitting device can be reduced. Further, while the area of the upper surface 108 of the translucent material 102, which is the light emitting surface, can be made small, the contact surface area between the translucent material 102 and the light reflecting resin 103 can be made large to produce a light emitting device with exceptional brightness and thermal dissipation. Still further, even with fluorescent material added, a light emitting device with little color non-uniformity can be achieved.

INDUSTRIAL APPLICATION

The present invention can be used in various lighting applications such as a lighting source, various indicator light sources, an automotive light source, a display light source, a liquid crystal backlight source, traffic signals, automotive parts, and channel letter signs.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Applications No. 2009-101519 filed in Japan on Apr. 20, 2009, and No. 2010-80156 filed in Japan on Mar. 31, 2010, the contents of which are incorporated herein by references.

What is claimed is:

1. A light emitting device comprising:
   a light emitting element with an upper, light emitting surface;
   a translucent material with an upper surface and a lower surface, where light from the light emitting element is incident on the lower surface of the translucent material, and light is emitted to an area outside the light emitting device through the upper surface of the translucent material; and
   a light reflecting resin that covers at least a part of the translucent material,
   wherein the translucent material includes a covered region that is covered with the light reflecting resin and a non-covered region that is exposed to the area outside the light emitting device, wherein an area of the non-covered region on the upper surface of the translucent material is smaller than an area of the lower surface of the translucent material,
   wherein the area of the lower surface of the translucent material is larger than an area of the upper surface of the light emitting element,
   wherein the lower surface of the translucent material includes a first, bonded surface portion that is joined with the upper surface of the light emitting element, and a second surface portion that is covered by the light reflecting resin outside an upper region of the light emitting element.

2. The light emitting device as claimed in claim 1, wherein the second surface portion of the lower surface of the translucent material is covered with a light reflecting material that is different from the light reflecting resin.

3. The light emitting device as claimed in claim 2, wherein the light reflecting material is a metallization layer.

4. The light emitting device as claimed in claim 1, wherein a bonding material is interposed between the lower surface of the translucent material and the upper surface of the light emitting element at the first, bonded surface portion.

5. The light emitting device as claimed in claim 4, wherein the bonding material extends onto the second surface portion.

6. The light emitting device as claimed in claim 1, wherein the second surface portion is covered with the light reflecting resin.

7. The light emitting device as claimed in claim 6, wherein a first perimeter side region around the upper surface of the translucent material is recessed with respect to a second perimeter side region around the lower surface of the translucent material.

8. The light emitting device as claimed in claim 6, wherein the translucent material has a recessed portion at a perimeter side region around the upper surface of the translucent material, and the recessed portion is filled with the light reflecting resin.

9. The light emitting device as claimed in claim 7, wherein, in a plan view of the upper surface of the translucent material, the light reflecting resin around the upper surface of the translucent material is positioned inside the second perimeter side region around the lower surface of the translucent material.

10. The light emitting device as claimed in claim 8, wherein the translucent material has a protruding portion which protrudes outwardly away from the upper surface of the translucent material, and the protruding portion has an extending surface which extends outwardly from the perimeter side region around the upper surface of the translucent material and forms the recessed portion of the translucent material, and wherein the light reflecting resin is in contact with the extending surface of the protruding portion of the translucent material to fill the recessed portion.

11. The light emitting device as claimed in claim 9, wherein the protruding portion of the translucent material is positioned under the reflecting resin filling the recessed portion of the translucent material.

12. The light emitting device as claimed in claim 6, wherein the upper surface and the lower surface of the translucent material are approximately parallel planar surfaces.

13. The light emitting device as claimed in claim 11, wherein the upper surface of the translucent material is in approximately the same plane as a top surface of the light reflecting resin.

14. The light emitting device as claimed in claim 1, wherein an area of the second surface portion is 10% to 100% of an area of the first, bonded surface portion.

15. The light emitting device as claimed in claim 1, further comprising a substrate supporting the light emitting element and the light reflecting resin.

16. The light emitting device as claimed in claim 1, wherein the translucent material includes fluorescent material.

17. The light emitting device as claimed in claim 1, wherein side surfaces of the light emitting element are covered by the light reflecting resin.

18. The light emitting device as claimed in claim 1, wherein the light emitting element includes a pair of electrodes on a lower surface of the light emitting element that opposes the upper surface of the light emitting element.

19. The light emitting device as claimed in claim 1, wherein the translucent material has a vertical surface on at least a part of a perimeter side region of the translucent material.

20. The light emitting device as claimed in claim 19, wherein the vertical surface is contiguous to the upper surface of the translucent material.

21. The light emitting device as claimed in claim 19, wherein the vertical surface is contiguous to the lower surface of the translucent material.

22. The light emitting device as claimed in claim 1, wherein the translucent material has an inclined surface on at least a part of a perimeter side region of the translucent material.

23. The light emitting device as claimed in claim 1, wherein the bonding material includes fluorescent material.

* * * * *